US011739418B2

(12) United States Patent
Zhu et al.

(10) Patent No.: US 11,739,418 B2
(45) Date of Patent: *Aug. 29, 2023

(54) METHOD AND APPARATUS FOR DEPOSITION OF METAL NITRIDES (71) Applicant: Applied Materials, Inc, Santa Clara, CA (US)

(72) Inventors: Mingwei Zhu, San Jose, CA (US); Zihao Yang, Santa Clara, CA (US); Nag B. Patibandla, Pleasanton, CA (US); Ludovic Godet, Sunnyvale, CA (US); Yong Cao, San Jose, CA (US); Daniel Lee Diehl, Chiba (JP); Zhebo Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/823,182

(22) Filed: Mar. 18, 2020

(65) Prior Publication Data
US 2020/0299830 A1 Sep. 24, 2020

Related U.S. Application Data (60) Provisional application No. 62/822,585, filed on Mar. 22, 2019.

(51) Int. Cl.
C23C 14/34 (2006.01)
C23C 14/56 (2006.01)
(Continued)

(52) U.S. Cl.
CPC ........ *C23C 14/564* (2013.01); *C23C 14/0641* (2013.01); *C23C 14/34* (2013.01);
(Continued)

(58) Field of Classification Search
CPC . C23C 14/0641; C23C 14/34; C23C 14/3485; C23C 14/35; C23C 14/52;
(Continued)

(56) References Cited

U.S. PATENT DOCUMENTS 4,726,890 A * 2/1988 Thakoor ............. H01L 39/2416
204/192.15
4,997,719 A * 3/1991 Ohshima ................. H01L 39/02
428/930

(Continued)

FOREIGN PATENT DOCUMENTS

CN 1813317 8/2006
CN 101914753 12/2010
(Continued)

OTHER PUBLICATIONS

Machine Translation JP 07-011438. (Year: 1995).*

(Continued)

*Primary Examiner* — Rodney G McDonald
(74) *Attorney, Agent, or Firm* — Fish & Richardson P.C.

(57) ABSTRACT

A structure including a metal nitride layer is formed on a workpiece by pre-conditioning a chamber that includes a metal target by flowing nitrogen gas and an inert gas at a first flow rate ratio into the chamber and igniting a plasma in the chamber before placing the workpiece in the chamber, evacuating the chamber after the preconditioning, placing the workpiece on a workpiece support in the chamber after the preconditioning, and performing physical vapor deposition of a metal nitride layer on the workpiece in the chamber by flowing nitrogen gas and the inert gas at a second flow rate ratio into the chamber and igniting a plasma in the chamber. The second flow rate ratio is less than the first flow rate ratio.

19 Claims, 7 Drawing Sheets (51) Int. Cl.
*C23C 14/06* (2006.01)
*H01J 37/34* (2006.01)

(52) U.S. Cl.
CPC ...... *H01J 37/3405* (2013.01); *H01J 37/3441* (2013.01); *H01J 37/3464* (2013.01); *H01J 2237/24514* (2013.01)

(58) Field of Classification Search
CPC .................. C23C 14/544; C23C 14/564; H01J 37/32449; H01J 37/32935; H01J 37/3405; H01J 37/3441; H01J 37/3464; H01J 2237/24514; H01L 39/2416
See application file for complete search history.

(56) References Cited

U.S. PATENT DOCUMENTS

| | | |
|---|---|---|
| 6,328,858 B1 | 12/2001 | Felsenthal et al. |
| 6,475,902 B1 | 11/2002 | Hausmann et al. |
| 7,432,201 B2 | 10/2008 | Takehara et al. |
| 7,563,715 B2 | 7/2009 | Haukka et al. |
| 8,324,095 B2 | 12/2012 | Chung et al. |
| 8,968,538 B2 | 3/2015 | Kitada et al. |
| 11,437,559 B2 | 9/2022 | Zhu et al. |
| 2005/0205416 A1 | 9/2005 | Stachowiak |
| 2006/0169582 A1 | 8/2006 | Brown et al. |
| 2008/0272463 A1 | 11/2008 | Scott et al. |
| 2009/0233798 A1 | 9/2009 | Maeda et al. |
| 2010/0326818 A1 | 12/2010 | Ikemoto et al. |
| 2011/0165347 A1 | 7/2011 | Miller et al. |
| 2012/0111833 A1 | 5/2012 | Nakamura et al. |
| 2012/0228122 A1* | 9/2012 | Minami ............... H01J 37/3455 204/192.1 |
| 2013/0048489 A1* | 2/2013 | Yamaguchi ............. C23C 14/35 204/192.15 |
| 2014/0034489 A1 | 2/2014 | Kajihara et al. |
| 2014/0054164 A1 | 2/2014 | Yamguchi et al. |
| 2014/0299751 A1 | 10/2014 | Tang et al. |
| 2015/0279635 A1 | 10/2015 | Subramani et al. |
| 2016/0093508 A1 | 3/2016 | Ogawa |
| 2016/0233328 A1 | 8/2016 | Cheng et al. |
| 2018/0223421 A1 | 8/2018 | Wang et al. |
| 2018/0230586 A1* | 8/2018 | Wang .................. H01L 21/0254 |
| 2020/0303616 A1 | 9/2020 | Zhu et al. |

FOREIGN PATENT DOCUMENTS

| | | |
|---|---|---|
| CN | 103165811 | 6/2013 |
| CN | 106133877 | 11/2016 |
| EP | 0799903 | 10/1997 |
| EP | 0861921 | 9/1998 |
| JP | S64-011379 | 1/1989 |
| JP | H01-135080 | 5/1989 |
| JP | H04-028871 | 1/1992 |
| JP | 07-011438 | * 1/1995 |
| JP | H09-067671 | 3/1997 |
| JP | 2001-335927 | 12/2001 |
| JP | 2007-302508 | 11/2007 |
| JP | 2010-126789 | 6/2010 |
| JP | 5661452 | 1/2015 |
| JP | 2016-072454 | 5/2016 |
| JP | 2016-141861 | 8/2016 |
| JP | 2017-517625 | 6/2017 |
| WO | WO 2010-025068 | 3/2010 |
| WO | WO 2011/007580 | 1/2011 |
| WO | WO 2011/117916 | 9/2011 |

OTHER PUBLICATIONS

PCT International Search Report and Written Opinion in International Appln. No. PCT/US2020/023426, dated Jul. 8, 2020, 14 pages.

Shiino et al., "Improvement of the critical temperature of superconducting NbTiN and NbN thin films using the AlN buffer layer," Supercond. Sci. Tech., Mar. 2010, 23(4):045004.

Office Action in Japanese Appln. No. 2021555613, dated Oct. 5, 2022, 28 pages (with English translation and search report).

Sun et al. "Epitaxial NbN/AlN/NbN tunnel junctions on Si substrates with TiN buffer layers" AIP Advances, vol. 6, 2016, pp. 065119-1 to 065119-6.

Cavalleri et al., "Characterization of niobium nitride thin films prepared by ion-assisted deposition, " Thin Solid Films, Jun. 5, 1991, 201(1): 147-154.

Extended European Search Report in European Appln. No. 20778127, dated Nov. 22, 2022, 12 pages.

Nakahara et al., "Microstructure trends in metal(aluminum, copper, indium, lead, tin)-metal oxide thin films prepared by reactive ion beam sputter deposition," Thin Solid Films, Apr. 29, 1983, 102(4): 345-360.

Singer IL et al., "Abrasion resistance, microhardness and microstructures of single-phase niobium nitride films," Thin Solid Films, Sep. 16, 1983, 107(2): 207-15.

Office Action in Japanese Appln. No. 2021-556225, dated Nov. 15, 2022, 6 pages (with English translation).

* cited by examiner

METHOD AND APPARATUS FOR DEPOSITION OF METAL NITRIDES

CROSS-REFERENCE TO RELATED APPLICATIONS

This application claims priority to U.S. Application Ser. No. 62/822,585, filed on Mar. 22, 2019, the disclosure of which is incorporated by reference.

BACKGROUND

Technical Field

The disclosure concerns a reactor for processing a workpiece to deposit a metal nitride, particularly a metal nitride that is suitable as a superconductive material.

Background Discussion

Figure 1:
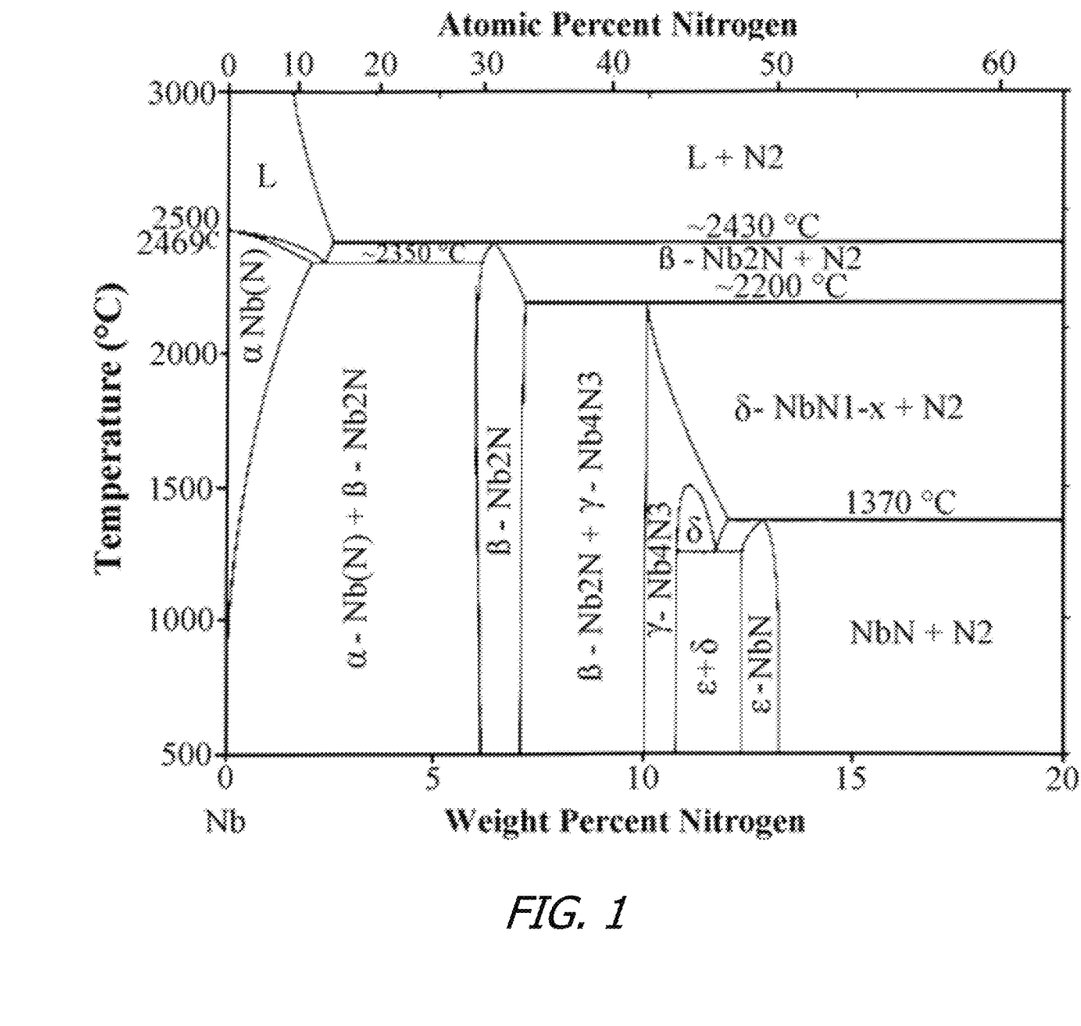
FIG. 1 is diagram illustrating phase of niobium nitride as a function of processing temperature and atomic percentage nitrogen.

In the context of superconductivity, the critical temperature (Tc) refers to the temperature below which a material becomes superconductive. Niobium nitride (NbN) is a material that can be used for superconducting applications, e.g., superconducting nanowire single photon detectors (SNSPD) for use in quantum information processing, defect analysis in CMOS, LIDAR, etc. The critical temperature of niobium nitride depends on the crystalline structure and atomic ratio of the material. For example, referring to FIG. 1, cubic δ-phase NbN has some advantages due to its relatively "high" critical temperature, e.g., 9.7-16.5° K.

Niobium nitride can be deposited on a workpiece by physical vapor deposition (PVD). For example, a sputtering operation can be performed using a niobium target in the presence of nitrogen gas. The sputtering can be performed by inducing a plasma in the reactor chamber that contains the target and the workpiece.

SUMMARY

In one aspect, a method of forming a structure including a metal nitride layer on a workpiece includes pre-conditioning the chamber by flowing nitrogen gas and an inert gas at a first flow rate ratio into the chamber and igniting a plasma in the chamber before placing the workpiece in a chamber that includes a metal target, evacuating the chamber after the preconditioning, placing the workpiece on a workpiece support in the chamber after the preconditioning, and performing physical vapor deposition of a metal nitride layer on the workpiece in the chamber by flowing nitrogen gas and the inert gas at a second flow rate ratio into the chamber and igniting a plasma in the chamber. The second flow rate ratio is less than the first flow rate ratio.

In another aspect, a physical vapor deposition system includes chamber walls forming a chamber, a support to hold a workpiece in the chamber, a vacuum pump to evacuate the chamber, a gas source to deliver nitrogen gas and an inert gas to the chamber, an electrode to support a metal target, a power source to apply power to the electrode, and a controller. The controller is configured to cause the gas source to flow nitrogen gas and the inert gas at a first flow rate ratio into the chamber and cause the power source to apply power sufficient to ignite a plasma in the chamber to pre-condition a chamber before a workpiece on which a metal nitride layer is to be deposited is placed in the chamber, and to cause the gas source to flow nitrogen gas and the inert gas at a second flow rate ratio into the chamber and cause the power source to apply power sufficient to ignite a plasma in the chamber to deposit a metal nitride layer on the workpiece by physical vapor deposition after the workpiece is placed in the chamber. The second flow rate ratio is less than the first flow rate ratio.

In another aspect, a cluster tool for fabrication of a device having a metal nitride layer includes a load lock chamber to receive a cassette holding workpieces, a central vacuum chamber, a plurality of deposition chambers arranged in a cluster formation around and coupled to the central vacuum chamber, a robot to carry a workpiece between the vacuum chamber and the load lock chamber and plurality of deposition chambers, and a controller. The plurality of deposition chambers include a first deposition chamber having a first target, a second deposition chamber having a second target, and a third deposition chamber having a third target. The controller is configured to cause the robot to carry the substrate to the first deposition chamber and to cause the first deposition chamber to deposit a buffer layer on the workpiece, to cause the robot to carry the substrate from the first deposition chamber to the second deposition chamber and to cause the second deposition chamber to deposit a metal nitride layer suitable for use as a superconductor at temperatures above 8° K on the buffer layer, and to cause the robot to carry the substrate from the second deposition chamber to the third deposition chamber and to cause the third deposition chamber to deposit a capping layer on the metal nitride layer.

In another aspect, a physical vapor deposition system includes chamber walls forming a chamber, a first target support to hold a first target, a second target support to hold a second target, and a third target support to hold a third target, a movable shield positioned in the chamber and having an opening therethrough, an actuator to move the shield, a workpiece support to hold a workpiece in a lower portion of the chamber, a vacuum pump to evacuate the chamber, a gas source to deliver nitrogen gas and an inert gas to the chamber, a power source to selectively apply power to the first target, the second target or the third target, and a controller. The controller is configured to cause the actuator to move the shield to position the opening adjacent the first target, cause the gas source to flow a first gas into the chamber, cause the power source to apply power sufficient to ignite a plasma in the chamber to cause deposition of a buffer layer of a first material on the workpiece on the workpiece support, cause the actuator to move the shield to position the opening adjacent the second target, cause the gas source to flow a second gas into the chamber, cause the power source to apply power sufficient to ignite a plasma in the chamber to cause deposition of a device layer of a second material that is a metal nitride suitable for use as a superconductor at temperatures above 8° K on the buffer layer with the first material being different in composition from the second material, cause the actuator to move the shield to position the opening adjacent the third target, cause the gas source to flow a third gas into the chamber, and cause the power source to apply power sufficient to ignite a plasma in the chamber to cause deposition of a capping layer of a third material on the device layer with the third material being different in composition from the first and second materials.

These aspects can include one or more of the following features.

The metal target may include niobium or a niobium alloy. The metal nitride layer may include niobium nitride or a niobium alloy nitride. The metal target may be substantially pure niobium, and the metal nitride layer may be substantially pure niobium nitride. The metal nitride layer may be δ-phase NbN. The plasma may sputter the metal of the metal target.

The second flow rate ratio may be 2-30% less than the first flow rate ratio. The first flow rate ratio may be 4:100 to 1:1, and the second flow rate ratio may be 3:100 to 48:52. The chamber may be evacuated to a pressure lower than $10^{-8}$ Torr.

Pre-conditioning may include placing a shutter disk on the substrate support. A robot may be configured to position a shutter disk into the chamber for the pre-condition of the chamber. Pre-conditioning may include heating the shutter disk to a temperature, and performing the physical vapor deposition may include heating the workpiece to the same temperature. The temperature may be 200-500° C. Igniting plasma in preconditioning and igniting plasma in deposition may use the same power level.

A nitrogen ion concentration in the plasma may be measured with an optical sensor. A flow rate of the nitrogen gas and/or the inert gas may be adjusted in response to nitrogen ion concentration measured by the sensor to bring the nitrogen ion concentration to a desired concentration. The sensor is positioned outside the chamber, and wherein the chamber walls include a window to provide optical access to the chamber for the sensor.

A sputter shield may be positioning in the chamber. The sputter shield may have an opening to provide a clear line of sight for the sensor to the plasma.

A buffer layer may be formed on the workpiece before forming the metal nitride layer. The metal nitride layer may be deposited directly on the buffer layer. The buffer layer may be a metal nitride of a metal different than the metal of the target. The buffer layer may be aluminum nitride.

A capping layer may be formed on the metal nitride layer. The capping layer may include carbon, silicon, a metal different than the metal of the target, or a nitride of a material different than the metal of the target. The capping layer may be carbon, silicon nitride or titanium nitride.

The first target may be a metal other than a metal of the second target. The first gas may include nitrogen gas. The second target may include niobium. The second gas may include nitrogen gas. The third target may include carbon, silicon, or a metal other than a metal of the second target.

The shield may be rotatable and the actuator may be configured to rotate the shield.

Some implementations may provide one or more of the following advantages. The process permits reliable or stable deposition of high quality NbN with a high critical temperature. This permits fabrication of devices, e.g., SNSPD, that operate at higher temperatures, thus making such devices more practical. Devices can be fabricated with higher quantum efficiency and low dark current. Devices can also be fabricated with reduced timing jitter and faster detection response. A buffer layer, a superconductive film, and a capping layer can be deposited by a single tool without removing the workpiece from vacuum. This can significantly improve process stability and manufacturability, and reduces risk of contamination, e.g., oxidation, which also helps preserve the high critical temperature.

The details of one or more implementations are set forth in the accompanying drawings and the description below. Other potential features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

As noted above, niobium nitride, particularly δ-phase NbN, has some advantages as a superconductive material. However, δ-phase NbN can be difficult to deposit at a satisfactory quality. For example, it may need a high vacuum ($10^{-9}$ Torr or lower), as well as high mobility species (high temp, high peak power, and low duty cycle in pulsed DC). Although semiconductor grade deposition tools can provide good uniformity, they typically are configured for a lowest vacuum of about $10^{-8}$ Torr. However, increased pump capacity and additional traps for smaller atomic weight gases, e.g., water vapor, can improve vacuum performance.

Another issue is that a buffer layer, e.g., an aluminum nitride (AlN) layer, below the (super)conductive layer can help improve the critical temperature of the metal nitride layer.

Similarly, a capping layer, e.g., a carbon layer or silicon nitride layer, above the (super)conductive layer can help protect the metal nitride layer, e.g., to prevent oxidation. The capping and buffer layer would typically be provided by separate deposition tools. Unfortunately, removing the workpiece from the tool used for deposition of the metal nitride can result in contamination or oxidation, thus reducing the critical temperature. However, a cluster tool can be configured to have multiple chambers, each of which can deposit a layer without removing the workpiece from the vacuum environment, or a single chamber can be configured to deposit each of the layers, thereby avoiding the need to remove the workpiece.

Yet another issue is that even under good deposition conditions, reliably depositing a film with as high a critical temperature as possible can be difficult. However, it has been discovered that the critical temperature of niobium nitride as a function of nitrogen content exhibits a hysteresis effect; different critical temperatures can be obtained depending on whether the nitrogen content has been ramped up or ramped down. By performing a preconditioning of the chamber using nitrogen gas before depositing the layer on the workpiece, the process can follow the more advantageous curve of this hysteresis effect. As a result, a higher critical temperature can be obtained more reliably.

Deposition System

Figure 2:
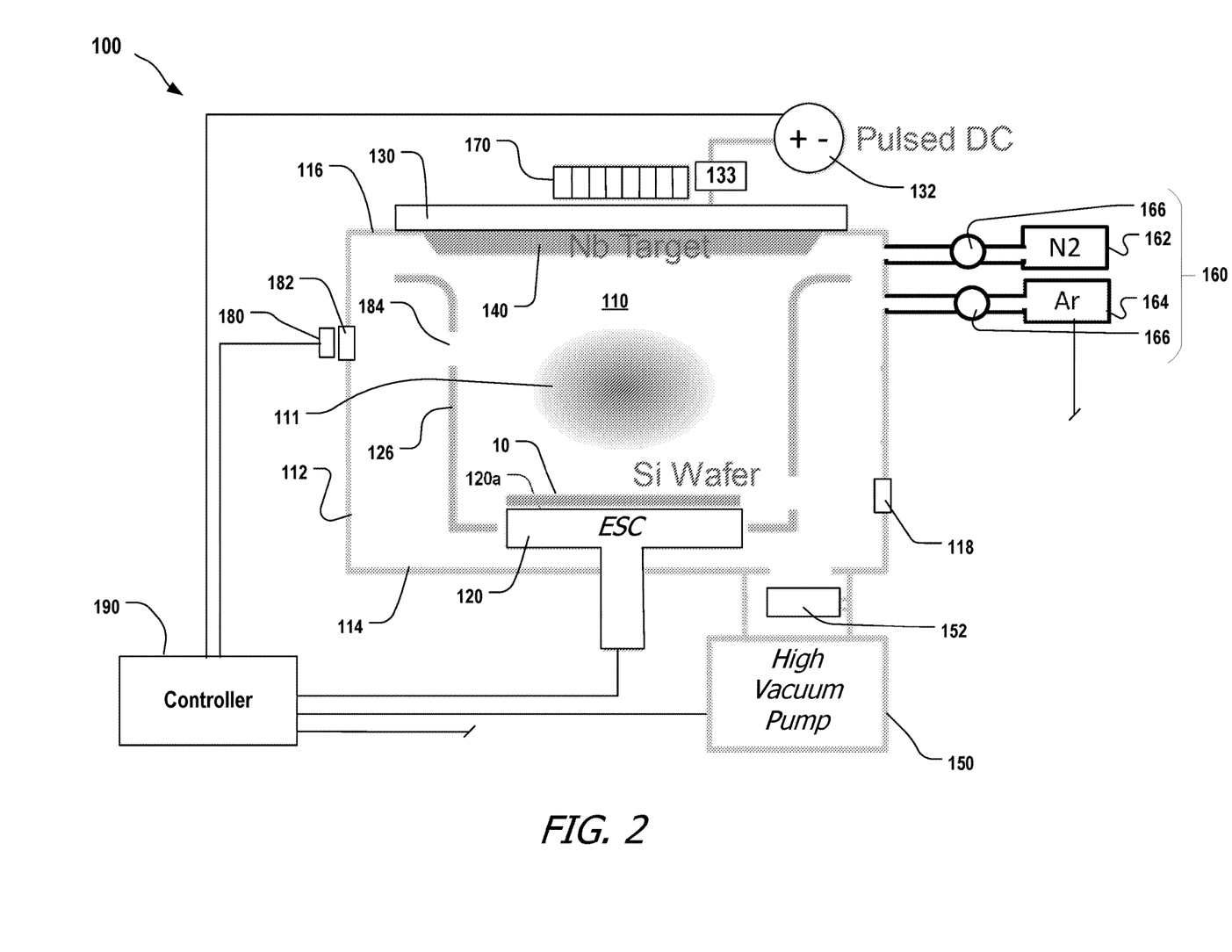
FIG. 2 is a schematic cross-sectional side view of a reactor to deposit metal nitrides.

Referring now to FIG. 2, a physical vapor deposition (PVD) reactor 100 includes a vacuum chamber 110. The chamber 110 is enclosed by chamber walls, including a side wall 112, a floor 114 and a ceiling 116. A workpiece support 120, e.g., a pedestal or susceptor, can be positioned inside the chamber 110. The workpiece support 120 has a top surface 120a to support a workpiece 10 inside the chamber 110. The support 120 can be elevated above the floor 114.

In some implementations, a temperature control system can control the temperature of the support 120. For example, the temperature control system can include a resistive heater embedded in or placed on the surface 120a of the workpiece support 120 and a power source electrically coupled to the heater. Alternatively or in addition, coolant channels can be formed in the workpiece support 120, and coolant from a coolant supply can flow, e.g., be pumped, through the channels.

In some implementations, the vertical position of the workpiece support 120 is adjustable, e.g., by a vertical actuator.

An opening 118 (e.g., a slit valve) can be formed in a wall of the chamber 110. An end effector (not shown) can extend through the opening 118 to place the substrate 10 onto lift pins (not shown) for lowering the substrate onto a support surface 120a of the workpiece support 120.

In some implementations, the support 120, or a conductive electrode 121 (see FIG. 8) within the support, is grounded. Alternatively, an external power source 136 (see FIG. 8), e.g., a DC or RF power source, can be used to apply a bias voltage or RF power to the support 120 or a conductive electrode 121 within the support 120, and thus apply a bias voltage or RF power to the workpiece 10. Optionally, the power source 136 can be coupled to the electrode 121 by an RF matching network 137 (see FIG. 8).

A sputter shield 126 can be positioned inside the chamber 110 to prevent sputtering of material onto the chamber side walls 112.

An electrode 130 forms a portion of the ceiling 116, and a target 140 can be supported from the electrode 130. The electrode 130 is electrically coupled to a power source 132. The power source 132 can be configured to apply a pulsed DC voltage. The power source 132 can be coupled to the electrode 10 by an RF matching network 133. The power applied can be 500 W to 20 kW, the voltage can be 200V to 600V, the frequency can be 50 kHz to 250 kHz, and the duty cycle can be 60-100%.

The target 140 is a body, e.g., a disk, formed of the metal from which the metal nitride is to be deposited. On installation, the target can be substantially pure metal, e.g., a body of substantially pure niobium. However, during processing nitrogen can react with the surface of the target, forming a surface layer of metal nitride.

A vacuum pump 150 is coupled to the chamber 110, e.g., by a passage with an opening in a region below the workpiece support 120, e.g., in the floor 112, to evacuate the chamber 110. Examples of vacuum pumps include an exhaust pump with throttle valve or isolation valve, cryogenic pump and turbo pump backed up by a mechanical pump. Although FIG. 2 illustrates a single vacuum pump, in some implementations multiple pumps can be used to increase the vacuum level. The assembly of one or more vacuum pumps 150 can bring the chamber down to a vacuum of less than $8 \times 10^{-9}$ Torr. The vacuum pumps 150 can maintain a rate of rise of less than 50 nTorr/min at the elevated deposition temperature.

A condensation plate 152 can be located in the passage connecting the chamber 110 to the vacuum pump 150. The condensation plate 152 provides a surface of or is positioned in the passage that is cooled sufficiently for water to condense on the plate 152. Thus, the condensation plate 152 acts to capture and trap water vapor, and other lower-weight molecules that can condense, thus preventing such gas from forming part of the plasma and reducing the impurity in the metal nitride film.

A gas source 160 is fluidically coupled to the chamber 110. The gas source 160 includes a source 162 of nitrogen gas ($N_2$) and a source 164 of an inert gas, e.g., argon or helium. Flow rates of the nitrogen gas and the inert gas, and thus the ratio of flow rates, can be controlled by independently controllable valves 166 and mass flow controllers. Although FIG. 2 illustrates separate passages entering the chamber, the gasses could be mixed before entering the chamber 110, and more complicated gas distributor apparatus, e.g., a gas distribution plate or showerhead, an array of radial passages through the side wall, etc., could be used to distribute gas into the chamber 110.

Application of power at an appropriate frequency and power to the electrode 130 by the power source 132 can ignite a plasma 111 in the chamber 110. In particular, a pulsed DC bias can be applied through the electrode 130 to the sputtering target 140, and the workpiece support 120 can be electrically floating. The resultant electric field in the chamber 110 ionizes the sputtering gas to form a sputtering plasma 111 that sputters the target 140, causing deposition of material on the workpiece 10. The plasma 111 is typically generated by applying a DC power level between 100 Watts and 20 kWatts, e.g., 1-5 kWatts. The power source 132 can supply DC pulses at a frequency 50 kHz to 250 KHz, e.g., 200 kHz. The duty cycle of the pulses can be 50-100%, e.g., 50-70% or 60-100%.

In some implementations, a magnet assembly 170 is positioned outside the chamber 110, e.g., above the ceiling 116. The magnet assembly 170 can help confine the ions in the plasma and increase ion energy on the substrate 10.

A controller 190, e.g., a programmed general purpose computer having a processor, memory and non-transitory storage media to store a computer program, can be coupled to the various components to control the processing system 100.

An optical emission sensor 180 can be used to monitors the plasma concentration and/or to monitor the gas composition during deposition. The sensor 180 can be positioned outside the chamber 110, but be placed adjacent a window 182 through a wall of chamber, e.g., the side wall 112, to have a view of the plasma 111. If necessary, an aperture 184 can be formed in the shield 126 to provide the sensor 180 with a clear line of sight to the plasma 111. The optical emission sensor 180 can measure the nitrogen ion concentration in the plasma 111. In some implementations, the optical emission sensor 180 can also measure the inert gas ion concentration in the plasma 111. The optical emission sensor 180 can provide these measurements to the controller 190.

The controller 190 can be configured to control the gas source 160 to adjust the flow rate(s) of the nitrogen gas and/or the inert gas in response to the measured ion concentration(s). For example, the controller 190 can operate in a feedback loop to control the gas flow rate(s) to bring the nitrogen ion partial pressure to a desired partial pressure, or to bring the nitrogen ion concentration to a desired concentration. The controller 190 can also be configured to control gas flow rates of the gas source 160 to maintain a stable plasma and/or achieve a desired condition on the surface of the target 140.

Deposition of Niobium Nitride

The workpiece processing tool 100 can be employed to perform deposition of niobium nitride, in particular δ-phase NbN, on a workpiece. In one example, the workpiece 110 includes a buffered layer, e.g., aluminum nitride, onto which the niobium nitride is to be deposited.

Figure 3:
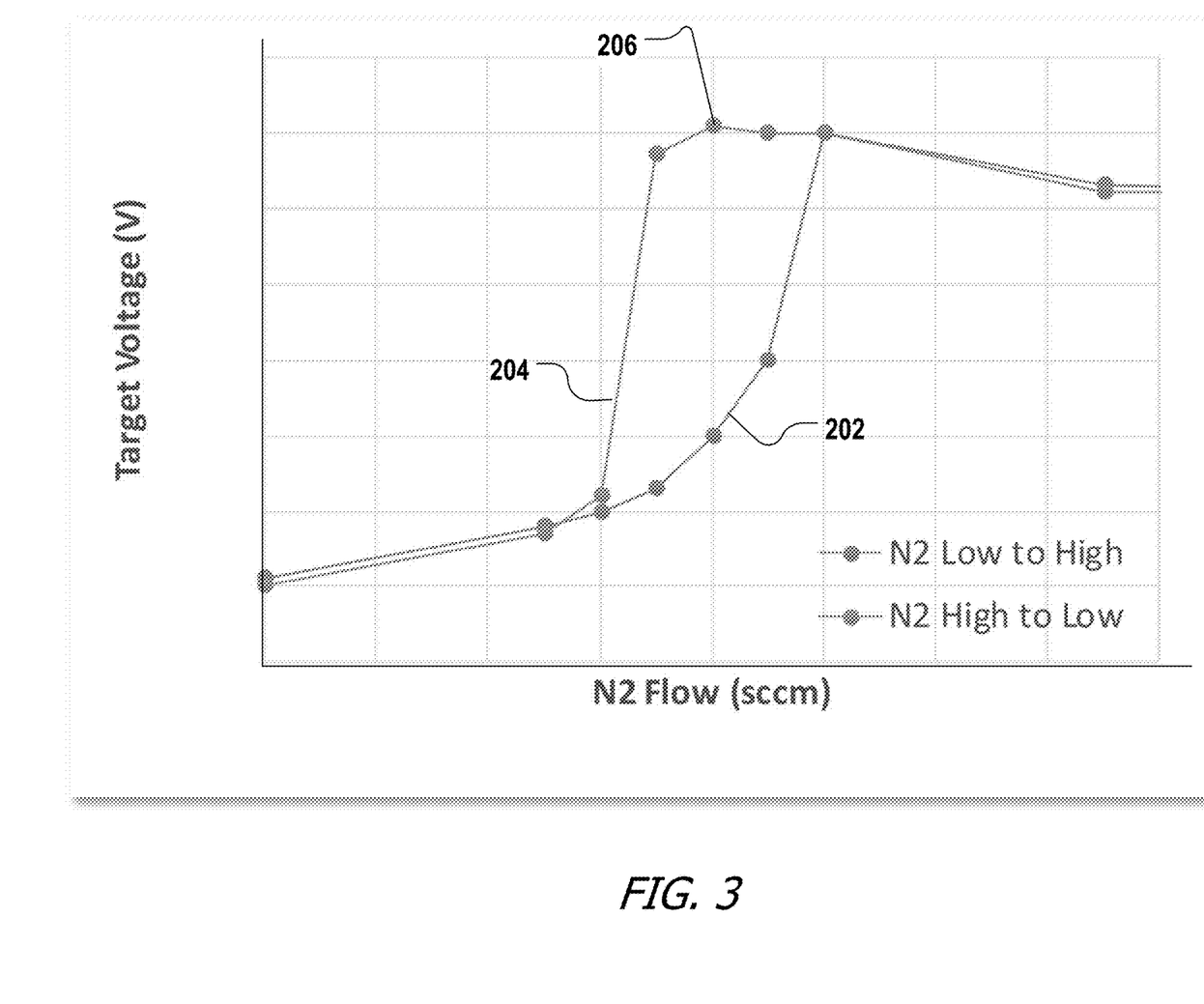
FIG. 3 is a graph illustrating voltage on the target as a function of nitrogen flow and critical temperatures measured for various nitrogen flow values.

FIG. 3 illustrates voltage on the target as a function of nitrogen flow. A fixed pulsed DC power was applied to the target. The potential of the target was measured with respect to the ground. This potential will change depending on the sputtering yield of the target and ion concentration in the plasma. In general, the target voltage can be a stand-in value for the critical temperature, albeit not as a linear relationship.

In general, a higher quality film will exhibit a higher critical temperature. As noted above, it has been discovered that the critical temperature of niobium nitride as a function of nitrogen content exhibits a hysteresis effect. Still referring to FIG. 3, where the nitrogen flow rate is being increased for successive workpieces, the target voltage follows curve 202. It is believed that the surface of the niobium target goes from a metallic mode to a "poisoned" mode when sufficient $N_2$ is present in the chamber to form a thin layer of NbN on the target surface. In contrast, where the nitrogen flow rate is being decreased for successive workpieces, the target voltage follows curve 204. Again, it is believed that as the $N_2$ partial pressure decreases, the target starts to become "de-poisoned" and switch back to the metallic mode.

For both curves 202, 204, the target voltage has a maximum value just before a sudden drop. It is believed that this is because niobium-rich niobium nitride (NbN) film is typically formed if the target is in the metallic mode, whereas a NbN film with good stoichiometry and desired cubic phase is typically formed if the target is in the poisoned mode.

However, where the flow rate is being successively decreased (curve 204), the drop-off of the target voltage occurs at a lower nitrogen flow rate. This may indicate that the partial pressure where the niobium target is de-poisoned, is lower than the partial pressure at which the niobium target becomes poisoned.

In addition, where the flow rate is being successively decreased, the target voltage actually reaches a higher value (indicated at 206), as compared to where the flow rate is being successively increased (curve 202). Moreover, measurement of the critical temperatures of the niobium nitride deposited at these flow rates confirms that a higher critical temperature can be achieved if the nitrogen flow rate has been decreased rather than increased as compared to a prior process.

It is possible to take advantage of this hysteresis effect. In particular, by performing a preconditioning of the chamber using nitrogen gas before depositing the layer on the workpiece, the process can follow the more advantageous curve of this hysteresis effect. As a result, a higher critical temperature can be obtained more reliably.

Figure 4:
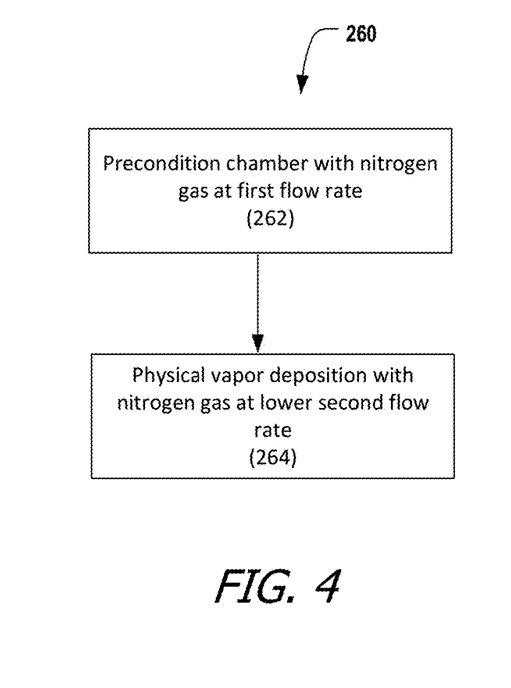
FIG. 4 is a flow chart of a process for depositing a metal nitride.

Referring to FIGS. 2 and 4, a process 260 for fabricating the metal nitride layer begins by preconditioning the chamber 110 (step 262). The chamber 110 is evacuated. A shutter disk, e.g., a metal disk of about the same diameter but thicker than a workpiece, can be placed on the support 120 (the workpiece on which the layer is to be deposited is not present in the chamber 110). The gas distribution assembly 160 supplies nitrogen gas to the chamber 110.

The gas distribution assembly 160 can also supply an inert gas, e.g., argon or helium, to the chamber 100. The inert gas can be used to dilute the nitrogen gas; this can increase plasma density. The gas distribution assembly 160 can establish a total pressure (nitrogen and inert gas) of 2 to 20 mTorr. In this preconditioning step, the nitrogen gas is supplied at a first flow rate, e.g., 15 to 40 sccm, e.g., 20 sccm. The nitrogen gas and the inert gas can be supplied at a first ratio, 4:100 to 1:4, e.g., 4:100 to 1:1, e.g., 2:1 to 1:1, of nitrogen to inert gas (the ratio can be a ratio of flow rates in sccm). Power is applied to the electrode 130, e.g., as described above, to induce the plasma 111.

This conditioning process can be carried out with the shutter disk at a temperature of, e.g., 200-500° C. The preconditioning process can proceed, e.g., for 60-300 seconds.

After preconditioning, the chamber is evacuated again, e.g., drawn down to $10^{-9}$ Torr, the dummy substrate is removed, and the workpiece is placed into the chamber 110 and onto the support 120.

Now the metal nitride can be formed on the workpiece by a physical vapor deposition process (step 264). The gas distribution assembly 160 supplies nitrogen gas to the chamber 110, and power is applied to the electrode 130, e.g., as described above, to induce a plasma 111. The power source 132 can apply the same RF power, frequency and duty cycle during deposition as in preconditioning.

In the deposition step, the nitrogen gas is supplied at a second flow rate that is lower than the first flow rate, while the flow rate of the inert gas remains the same as in the preconditioning step. For example, the second flow rate of the nitrogen gas can be at least 2% lower, e.g., at least 10% lower. For example, the second flow rate can be 2-30% lower, e.g., 10-30% lower. For example, the second flow rate can be 15-18 sccm.

Alternatively, the flow rate of the nitrogen gas could be held constant, but the flow rate of the inert gas could be increased.

In the deposition step, the nitrogen gas and the inert gas can be supplied at a second ratio, e.g., 3:100 to 1:6, e.g., 3:100 to 45:52, e.g., 1.5:1 to 1:3, of nitrogen to inert gas (the ratio can be a ratio of flow rates in sccm). The second ratio can be less than the first ratio, e.g., at least 2% lower, e.g., at least 10% lower. For example, the second ratio can be 2-30% lower, e.g., 10-30% lower.

This physical vapor deposition process can be carried out with the workpiece at a temperature of, e.g., 200-500° C. The workpiece can be processed at the same temperature as the shutter disk in the preconditioning process. The deposition process can proceed, e.g., for 10-600 seconds.

Application of power to the electrode 130 at appropriate frequency and duty cycle will ignite plasma in the chamber 110. The plasma will cause sputtering of material from the target 130 onto the workpiece 10. Due to the presence of nitrogen in the plasma, a combination of nitrogen and the metal, e.g., niobium nitride, is deposited onto the workpiece. The preconditioning process can enable the deposition of NbN of the right stoichiometry and crystal quality from the beginning to end of the deposition process.

Appropriate processing conditions for the physical vapor deposition to form δ-phase NbN should be about in the ranges discussed above, although differences in process chamber configuration, etc., can cause variations. If necessary, appropriate process conditions can be determined empirically.

Finally, the chamber 110 is evacuated again and the workpiece is removed.

Although the discussion above focuses on niobium nitride, these techniques can be applicable for other metal nitrides, e.g., a nitride of a mixture of niobium with another metal, e.g., NbTiN.

Multilayer Device

Figure 5:
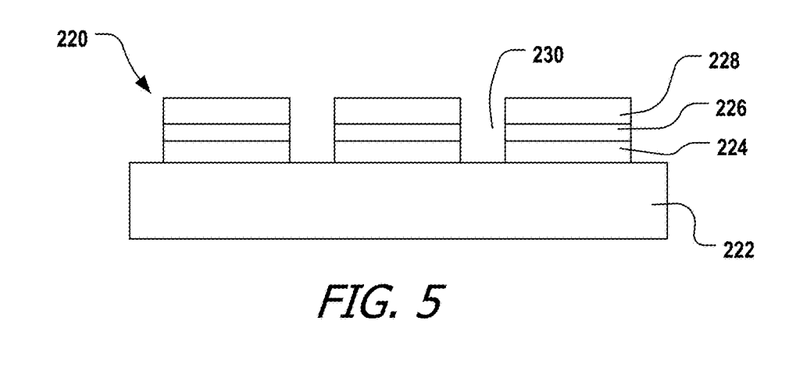
FIG. 5 is a schematic cross-sectional view of a device that includes a metal nitride layer for use as a superconductive material during operation.
Figure 6:
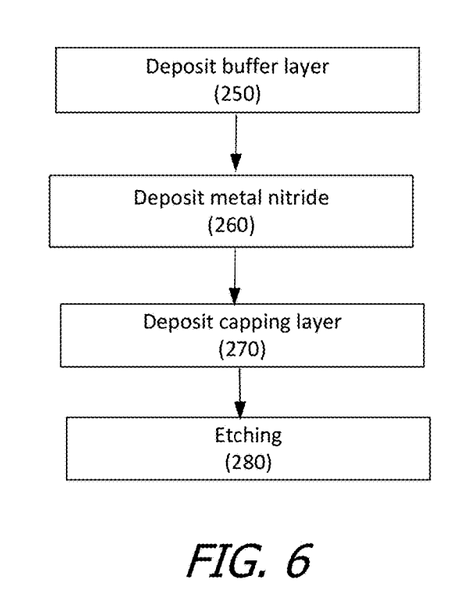
FIG. 6 is a flow chart of a process for fabricating a device that includes a metal nitride layer for use as a superconductive material.

FIG. 5 is a schematic illustration of some layers in a device 220 that includes a metal nitride layer 226 for use as a superconductive material. The device 220 could be superconducting nanowire single photon detectors (SNSPD), a superconducting quantum interference device (SQUID), a circuit in a quantum computer, etc. FIG. 6 is a flowchart of a method of fabrication of the layers.

Initially, a buffer layer 224 can be deposited on a substrate 222 (step 250). The substrate can be, for example, a silicon wafer. Although illustrated as a single block, the substrate 222 could include multiple underlying layers.

The buffer layer 224 can be a material to help improve the critical temperature of the metal nitride, especially when the metal nitride layer is thin. Alternatively or in addition, the buffer layer 224 can improve adhesion between the metal nitride layer 226 and the substrate 222. The buffer layer 224 can be dielectric or conductive but is not superconductive at the operating temperature of the device 200. In some implementations, the buffer layer 224 is formed of a different metal nitride than the metal nitride used for layer 226. For example, the buffer layer 224 can be formed of aluminum nitride (AlN), hafnium nitride (HfN), gallium nitride (GaN), or indium nitride (InN). Alternatively, the buffer layer 224 could be formed of a carbide, e.g., silicon carbide. The buffer layer can have a (002) c-axis crystal orientation. The buffer layer 224 can be deposited by a standard chemical vapor deposition or physical vapor deposition process.

Next, the metal nitride layer 226 is deposited on the buffer layer (step 260). The metal nitride layer 226 can be deposited using the two-step process 260 and system 100 discussed above.

After the metal nitride layer 226 is deposited, a capping layer 228 can be deposited on the metal nitride layer 226 (step 270). The capping layer 228 serves as a protective layer, e.g., to prevent oxidation of the metal nitride layer 226 or other types of contamination or damage. The capping layer 228 can be dielectric or conductive but is not superconductive at the operating temperature of the device 200. In some implementations, the capping layer 228 is a nitride of a different material from the metal of the metal nitride used for layer 226. In some implementations, the capping layer 228 is a metal different from the metal of the metal nitride used for layer 226. Examples of materials for the capping layer 228 include carbon, silicon, titanium nitride (TiN), and silicon nitride (SiN). The buffer layer 224 can be deposited by a standard chemical vapor deposition or physical vapor deposition process.

Etching can be used to form trenches 230 through at least the metal nitride layer 226 to form the conductive lines or other structures needed for the device (step 280). Although FIG. 4 illustrates the trench as extending through the buffer layer 224, metal nitride layer 226 and capping layer 228, other configurations are possible. For example, if the buffer layer 224 and capping layer 228 are both dielectric, then the etching can extend through just the metal nitride layer 226. In this case, the etching step 280 could be performed before the step 270 of depositing the capping layer. As a result, the capping layer 228 could directly contact the buffer layer 224 in regions between the metal nitride islands. For example, if the buffer layer 224 and capping layer 228 are both dielectric, then the etching can extend through just the metal nitride layer 226. As another example, the etch can extend through the metal nitride layer 226 and the buffer layer 224 or the capping layer 228 (but not both).

Tool for Multilayer Fabrication

As noted above, removing the workpiece from a tool used for deposition can result in contamination or oxidation, thus reducing the critical temperature.

Figure 7:
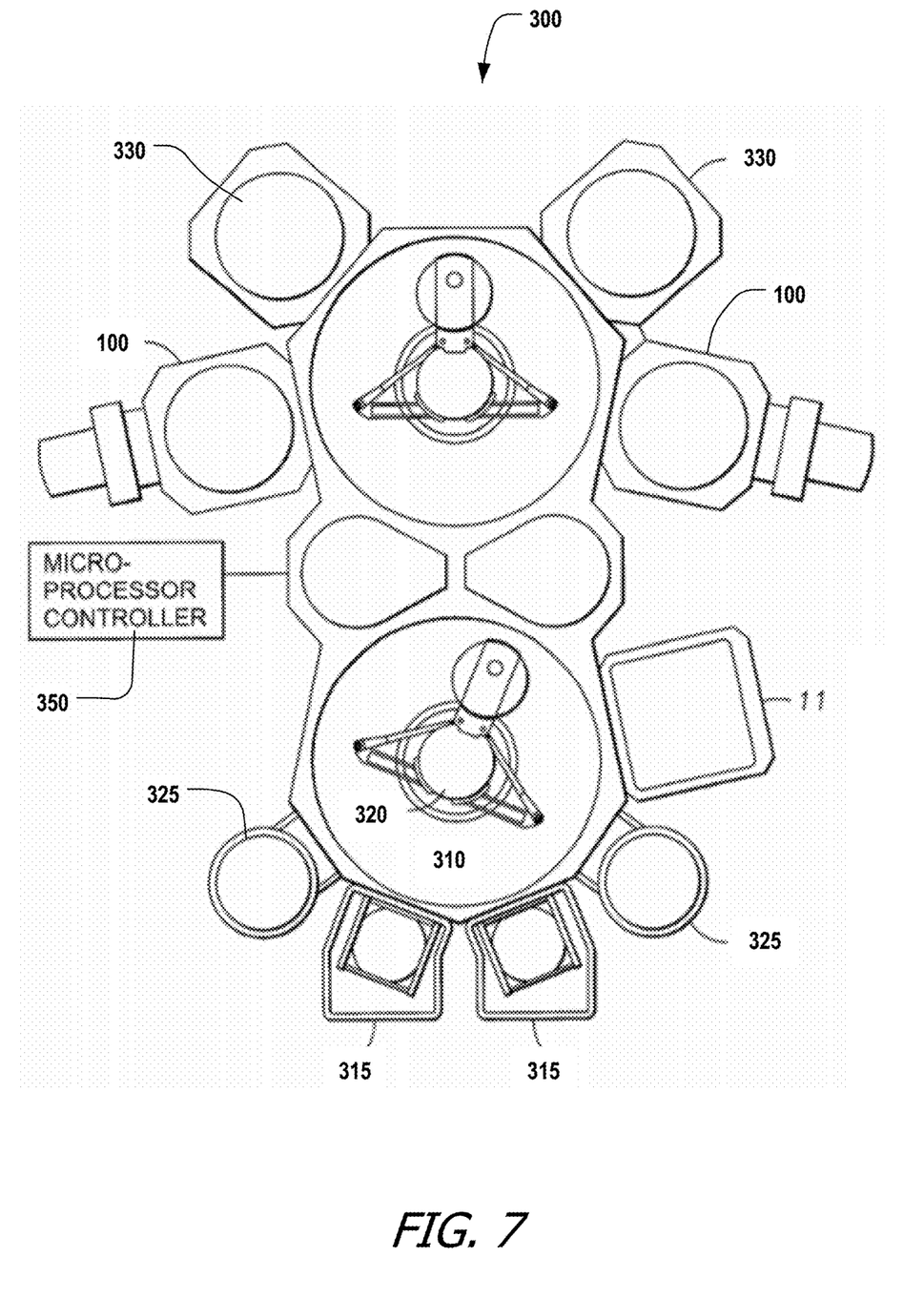
FIG. 7 is a schematic top view of a cluster tool to deposit a seed layer, a metal nitride, and a capping layer.

One technique to avoid this issue is to use a cluster tool with multiple chambers, each of which can deposit a layer without removing the workpiece from the vacuum environment. FIG. 7 is a schematic top view of a cluster tool 300 to deposit the buffer layer, the metal nitride layer, and the capping layer. The cluster tool 300 includes one or more central vacuum chambers 310, one or more fab interface units 315 to receive cassettes that hold workpieces, and one or more robots 320 to transfer workpieces from the fab interface units 315 to other processing chambers, between the processing chambers, and from the processing chambers back to the fab interface units 315.

The processing chamber of the cluster tool 300 includes one or more physical vapor deposition chambers 325 for deposition of the buffer layer, e.g., for deposition of aluminum nitride (AlN), one or more physical vapor deposition chambers, e.g., a physical vapor deposition chamber 100 as described above, for deposition of the metal nitride layer, and one or more physical vapor deposition chambers 330 for deposition of the capping layer, e.g., for deposition of a carbon layer. Chambers can be separated by appropriate slit valves. The cluster tool 300 can be controlled by a controller 350, e.g., a general purpose programmable computer.

Figure 8:
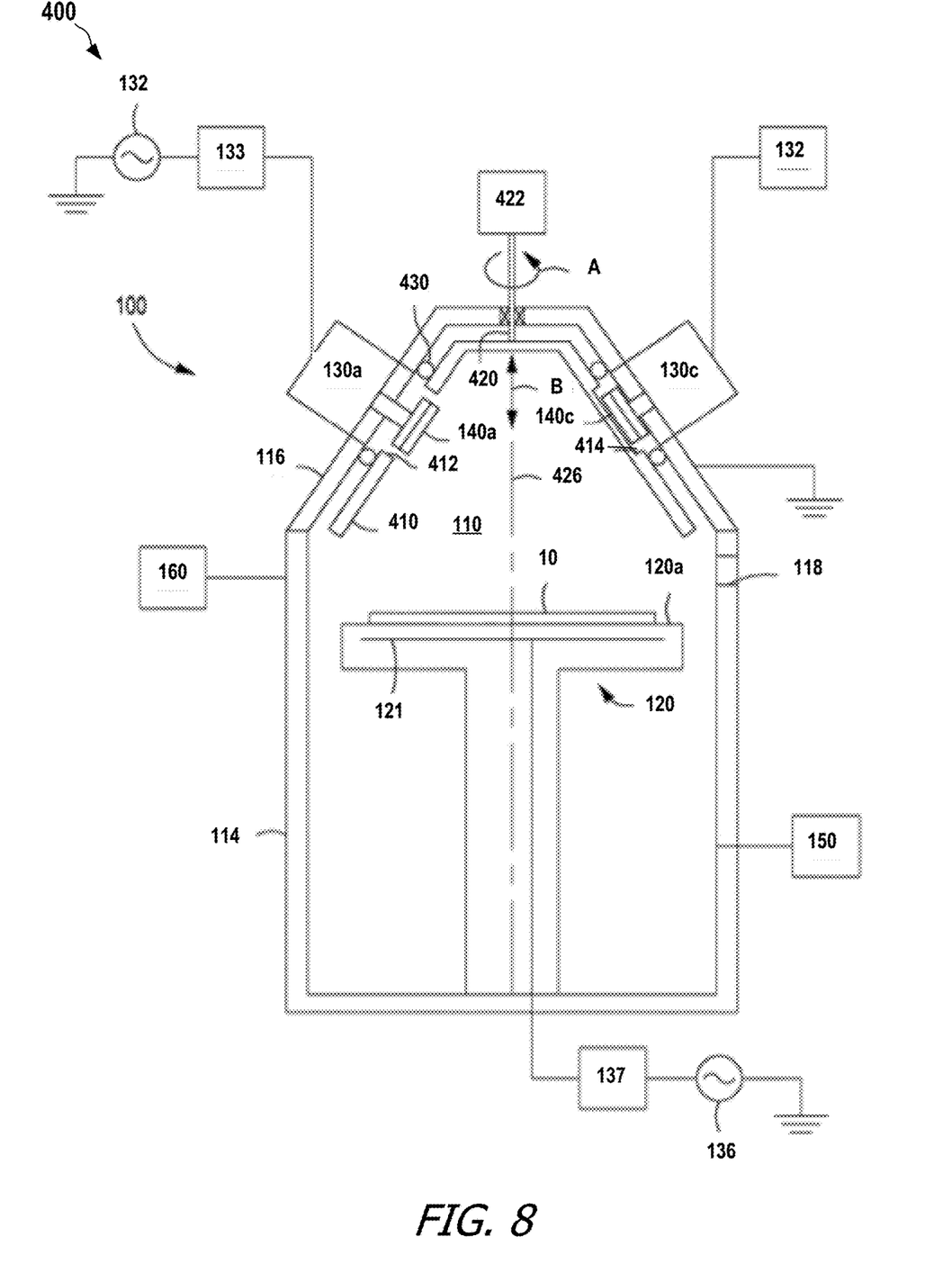
FIG. 8 is a schematic side view of a processing chamber to deposit multiple layers of different composition.
Figure 9:
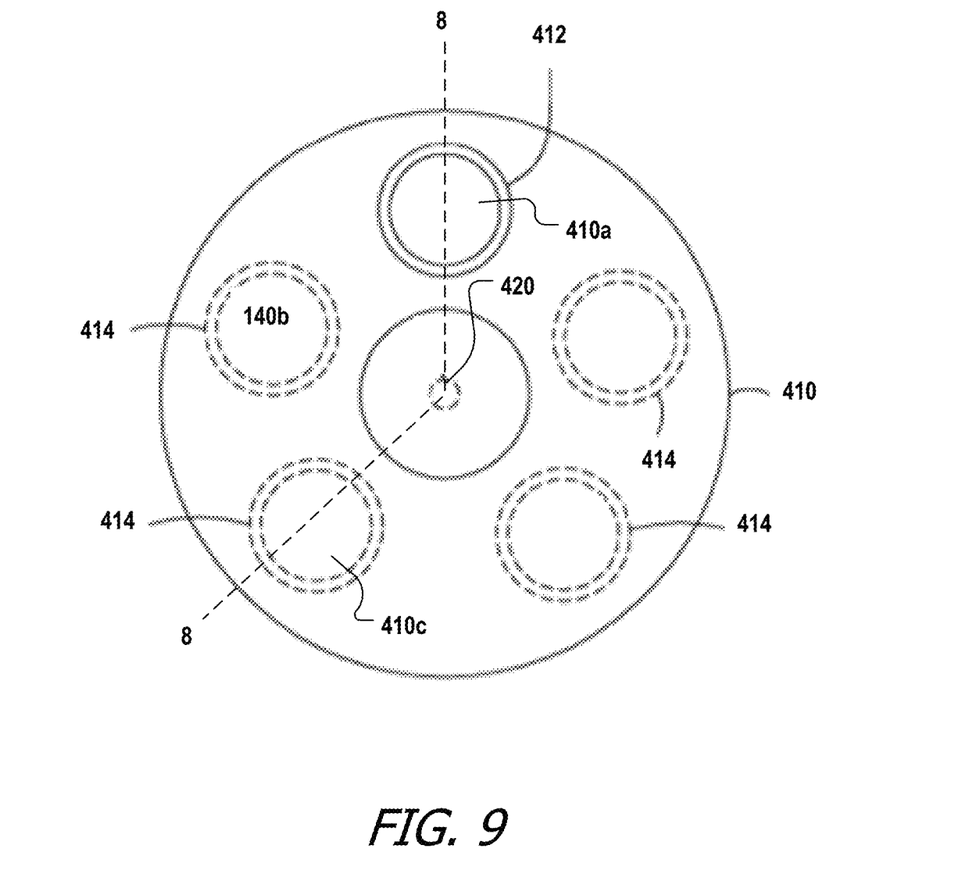
FIG. 9 is a schematic top view of the processing chamber of FIG. 8.

Another technique to avoid the need to remove the workpiece from vacuum is to deposit each of the layers in a single chamber. FIG. 8 is a schematic side view of a physical vapor deposition reactor 400 to deposit multiple layers of different composition. For example, the physical vapor deposition reactor 400 can be used to deposit the buffer layer, the metal nitride layer, and the capping layer. FIG. 9 is a top view of the physical vapor deposition reactor 400 (FIG. 8 can be considered along section line 8-8 in FIG. 9).

The physical vapor deposition reactor 400 is constructed in a manner similar to physical vapor deposition reactor 100, but includes three separate targets 140a, 140b, 140c (additional targets can be present if needed for other layers). The targets can be supported on the ceiling 116 of the chamber 110 of the reactor 400. Each target is supported on a respective electrode 130a-130c. The different electrodes 130a-130c can be coupled to a common power source 132, or to different power sources 132.

A rotatable shield 410 is positioned inside the chamber 110 and is shared by all the electrodes 130. The shield 410 can be suspended from the ceiling 116 by shaft 420, and the shaft can be rotated (shown by arrow A) about a vertical axis 426 by an actuator 422. In some implementations, the actuator 422 can also move the shield 410 vertically (shown by arrow B).

The rotatable shield 410 can have a hole 412 to expose a corresponding target. The shield 410 advantageously limits or eliminates cross-contamination between the plurality of targets 140a-140c. The rotatable shield 410 can also have a pocket 414 for each target that is not being sputtered. For example, in some embodiments where three electrodes 130 are provided, the shield 410 can include a hole 412 to expose one target at a time, and two pockets 414 to house the targets that are not being sputtered. By rotating the shield 410, a different target can be exposed and operated.

In some embodiments, the physical vapor deposition reactor 400 includes a plurality of grounding rings 430 to provide improved grounding of the shield 410 to the ceiling 116, e.g., when the shield 410 is in the retracted position.

The three targets 140a, 140b, 140c are formed of different materials, e.g., the materials to be sputtered to form the buffer layer, metal nitride layer and capping layer, respectively. For example, a first target 140a can be composed of the non-nitrogen component, e.g., the metal, of the element or compound used for the buffer layer. For example, if the buffer layer is to be formed of aluminum nitride, the first target 140a can be aluminum. The second target 140b can be the non-nitrogen component, e.g., the metal, of the compound used for the superconductive layer. For example, if the superconducting layer is to be formed of niobium nitride, the second target 140a can be niobium. The third target 140c can be the non-nitrogen component of the element or compound used in the capping layer, e.g., carbon, silicon or titanium.

In operation, the actuator 422 rotates the shield 410 so that the aperture 412 is aligned with the first target 140a and the other targets are covered. The vacuum pump 150 evacuates the chamber 110, the gas source 160 supplies a sputtering gas to the chamber 110, and the power source 132 applies a power to the electrode 130a to generate a plasma in the chamber. The plasma can cause sputtering of the material of the first target 140a, resulting in physical vapor deposition of the buffer layer onto the substrate 10. If appropriate, the gas source can supply nitrogen or another gas that will form a compound with the material of the first target 140a. For example, if aluminum nitride is to be deposited, the first target 140a can be aluminum and the gas source can supply both an inert gas, e.g., argon, and nitrogen. If the material of the first target 140a is to be deposited as a substantially pure element, then the gas can include only inert elements, e.g., argon or xenon.

When deposition of the buffer layer is complete, the chamber 110 is evacuated, and the actuator 422 rotates the shield 410 so that the opening 412 is aligned with the second target 140b and the other two targets are covered. The material of the metal nitride layer, e.g., niobium nitride, can be deposited according to the method described above.

When deposition of the metal nitride layer is complete, the chamber 110 is evacuated, and the actuator 422 rotates the shield 410 so that the opening 412 is aligned with the third target 140c. The material of the capping layer can be deposited, in a manner similar to described above for the buffer layer. The chamber 110 can evacuated again, and the workpiece removed, e.g., by a robot.

Controller

A controller, e.g., the controller 190 and/or controller 150, can be implemented in digital electronic circuitry, or in computer software, firmware, or hardware, or in combinations thereof. The controller can include one or more processors, e.g., a controller can be a distributed system. One or more computer program products, i.e., one or more computer programs tangibly embodied in a machine-readable storage media, can be executed by, or control the operation of, the controller, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The operations of the controller described in this specification can be performed by one or more programmable processors executing one or more computer programs to perform functions by operating on input data and generating output. The operations of the controller can also be performed by, and apparatus can also be implemented as, special purpose logic circuitry, e.g., an FPGA (field programmable gate array) or an ASIC (application-specific integrated circuit).

While particular implementations have been described, other and further implementations may be devised without departing from the basic scope of this disclosure. It is contemplated that elements and features of one embodiment may be beneficially incorporated in other embodiments without further recitation. It is to be noted, however, that the drawings illustrate only exemplary embodiments. The scope of the invention is determined by the claims that follow.

What is claimed is:

1. A method of forming a structure including a metal nitride layer on a workpiece, comprising:
   before placing the workpiece in a chamber that includes a niobium target, pre-conditioning the chamber by flowing nitrogen gas and an inert gas at a first flow rate ratio of nitrogen gas to inert gas into the chamber and igniting a first plasma in the chamber while the nitrogen gas and the inert gas are flowing at the first flow rate ratio;
   after the preconditioning, evacuating the chamber;
   after the preconditioning, placing the workpiece on a workpiece support in the chamber; and
   performing physical vapor deposition of a metal nitride layer on the workpiece in the chamber by flowing nitrogen gas and the inert gas at a second flow rate ratio of nitrogen gas to inert gas into the chamber and igniting a second plasma in the chamber while the nitrogen gas and the inert gas are flowing at the second flow rate ratio, wherein the second flow rate ratio is less than the first flow rate ratio such that a critical temperature of a resulting niobium nitride layer is increased as compared to the second flow rate ratio being greater than the first flow rate ratio, and wherein the second flow rate ratio comprises less nitrogen gas than the first flow rate ratio, and wherein the second flow rate ratio is sufficient that the resulting niobium nitride layer having the critical temperature of at least 9.7 Kelvin is deposited on the workpiece.

2. The method of claim 1, wherein the niobium target comprises a niobium alloy and the niobium nitride layer comprises a niobium alloy nitride.

3. The method of claim 1, wherein the second flow rate ratio comprises 2-30% less nitrogen than the first flow rate ratio.

4. The method of claim 1, wherein the first flow rate ratio of nitrogen gas to inert gas is 4:100 to 1:1, and the second flow rate ratio of nitrogen gas to inert gas is 3:100 to 48:52.

5. The method of claim 1, wherein pre-conditioning the chamber comprises placing a shutter disk on the workpiece support.

6. The method of claim 5, wherein pre-conditioning comprises heating the shutter disk to a temperature and performing a physical vapor deposition comprises heating the workpiece to the temperature of the shutter disk.

7. The method of claim 6, wherein the temperature is 200-500° C.

8. The method of claim 6, wherein igniting plasma in preconditioning and igniting plasma in physical vapor deposition uses a same power level.

9. The method of claim 1, comprising measuring a nitrogen ion concentration in the second plasma with an optical sensor.

10. The method of claim 9, comprising controlling a flow rate of the nitrogen gas and/or the inert gas in response to a nitrogen ion concentration measured by the sensor to bring the nitrogen ion concentration to a desired concentration.

11. The method of claim 1, wherein the second flow rate ratio is less than the first flow rate ratio so as to induce a critical temperature hysteresis effect.

12. A physical vapor deposition system, comprising:
chamber walls forming a chamber;
a support to hold a workpiece in the chamber;
a vacuum pump to evacuate the chamber;
a gas source to deliver nitrogen gas and an inert gas to the chamber;
an electrode supporting a niobium target;
a power source to apply power to the electrode; and
a controller configured to
    before a workpiece on which a metal nitride layer is to be deposited is placed in the chamber, cause the gas source to flow nitrogen gas and the inert gas at a first flow rate ratio of nitrogen gas to inert gas into the chamber and cause the power source to apply power sufficient to ignite a first plasma in the chamber to pre-condition the chamber while the nitrogen gas and the inert gas are flowing at the first flow rate ratio,
    after the workpiece is placed in the chamber, cause the gas source to flow nitrogen gas and the inert gas at a second flow rate ratio of nitrogen gas to inert gas into the chamber, wherein the second flow rate ratio is less than the first flow rate ratio and comprises less nitrogen gas than the first flow rate ratio, and
    cause the power source to apply power sufficient to ignite a second plasma in the chamber while the nitrogen gas and the inert gas are flowing into the chamber at the second flow rate ratio such that the critical temperature of a resulting metal nitride layer is increased as compared to the second flow rate ratio being greater than the first flow rate ratio and to deposit the resulting metal nitride layer having a critical temperature of at least 9.7 Kelvin on the workpiece by physical vapor deposition.

13. The system of claim 12, comprising an optical sensor to measure at least a nitrogen ion concentration in the second plasma in the chamber.

14. The system of claim 13, wherein the sensor is positioned outside the chamber, and wherein the chamber walls include a window to provide optical access to the chamber for the sensor.

15. The system of claim 14, further comprising a sputter shield positioning in the chamber, and wherein the shield has an opening to provide a clear line of sight for the sensor to the second plasma.

16. The system of claim 12, wherein the second flow rate ratio comprises 2 to 30% less nitrogen gas than the first flow rate ratio.

17. The system of claim 16, wherein the first flow rate ratio of nitrogen gas to inert gas is 4:100 to 1:1, and the second flow rate ratio of nitrogen gas to inert gas is 3:100 to 48:52.

18. The system of claim 12, comprising a robot configured to position a shutter disk into the chamber for the pre-condition of the chamber.

19. The system of claim 12, wherein the niobium target comprises a niobium alloy and the metal nitride layer comprises a niobium alloy nitride.

* * * * *

UNITED STATES PATENT AND TRADEMARK OFFICE
CERTIFICATE OF CORRECTION

PATENT NO. : 11,739,418 B2
APPLICATION NO. : 16/823182
DATED : August 29, 2023
INVENTOR(S) : Mingwei Zhu et al.

Page 1 of 1

It is certified that error appears in the above-identified patent and that said Letters Patent is hereby corrected as shown below:

On the Title Page

Item (57) in the abstract, Line 2, delete "pre-conditioning" and add -- preconditioning --.

In the Claims

Column 2, Line 29, Claim 1, delete "pre-conditioning" and add -- preconditioning --.

Column 2, Line 63, Claim 5, delete "pre-conditioning" and add -- preconditioning --.

Column 2, Line 66, Claim 6, delete "pre-conditioning" and add -- preconditioning --.

Signed and Sealed this
Seventeenth Day of October, 2023

Katherine Kelly Vidal
*Director of the United States Patent and Trademark Office*